United States Patent
Arnold et al.

(10) Patent No.: US 7,453,282 B2
(45) Date of Patent: Nov. 18, 2008

(54) INPUT AND OUTPUT CIRCUIT OF AN INTEGRATED CIRCUIT AND A METHOD FOR TESTING THE SAME

(75) Inventors: Ralf Arnold, Poing (DE); Martin Glas, Munich (DE); Christian Mueller, Woerth (DE); Hans-Dieter Oberle, Puchheim (DE)

(73) Assignee: Infineon Technologies AG, Neubiberg (DE)

( * ) Notice: Subject to any disclaimer, the term of this patent is extended or adjusted under 35 U.S.C. 154(b) by 115 days.

(21) Appl. No.: 11/439,450

(22) Filed: May 24, 2006

(65) Prior Publication Data

US 2006/0273820 A1 Dec. 7, 2006

Related U.S. Application Data

(63) Continuation of application No. PCT/DE2004/002588, filed on Nov. 23, 2004.

(30) Foreign Application Priority Data

Nov. 24, 2003 (DE) .................... 103 55 116

(51) Int. Cl.
*H03K 19/00* (2006.01)
(52) U.S. Cl. .......................... 326/16; 326/34
(58) Field of Classification Search .............. 326/16, 326/31–34
See application file for complete search history.

(56) References Cited

U.S. PATENT DOCUMENTS

| | | | |
|---|---|---|---|
| 5,134,402 A * | 7/1992 | Miyoshi | 341/144 |
| 5,859,860 A | 1/1999 | Whetsel | |
| 6,169,420 B1 * | 1/2001 | Coddington et al. | 326/83 |
| 6,199,182 B1 * | 3/2001 | Whetsel | 714/724 |
| 6,262,585 B1 | 7/2001 | Frodsham et al. | |
| 6,275,055 B1 | 8/2001 | Hyozo et al. | |
| 6,397,361 B1 | 5/2002 | Saitoh | |
| 6,819,539 B1 * | 11/2004 | Wright et al. | 361/90 |
| 2006/0186925 A1 * | 8/2006 | Chen | 326/122 |

OTHER PUBLICATIONS

Ulrich Tietze and Christoph Schenk, Halbleiter-Schaltungstechnik, 11,. Vollig neu bearb. Und erweiterte Auflage, Berlin (u.a.): Springer-Verlag, 1999, p. 198-200, 643-647.
Stephen K. Sunter and Benoit Nadeau-Dostie, Complete, Contactless I/O Testing—Reaching the Boundary in Minimizing Digital IC Testing Cost, Paper 16.2, ITC International Test Conference.
The Institute of Electrical and Electronics Engineers: IEEE Standard Test Access Port and Boundary-Scan Architecture. IEEE Standard 1149. la-1993, New York, 1993, p. 1-1 to 1-5; p. 8-2; p. 10-10 to 10-13; p. 10-21, 10-33, 10-35, 10-38.

* cited by examiner

*Primary Examiner*—James H Cho
(74) *Attorney, Agent, or Firm*—Edell, Shapiro & Finnan, LLC

(57) ABSTRACT

An integrated circuit includes at least one input and output circuit including: a signal terminal that provides an external contact; a protective circuit coupled to the signal terminal; an input driver and/or an output driver coupled to the signal terminal via the protective circuit; and an additional circuit including a first input coupled to the signal terminal via the protective circuit, and an output that provides a test value for operation of the input and output circuit.

13 Claims, 4 Drawing Sheets

INPUT AND OUTPUT CIRCUIT OF AN INTEGRATED CIRCUIT AND A METHOD FOR TESTING THE SAME

CROSS REFERENCE TO RELATED APPLICATIONS

This application is a continuation of PCT/DE2004/002588, filed Nov. 23, 2004, and titled "Input And Output Circuit Of An Integrated Circuit, Method For Testing An Integrated Circuit And Integrated Circuit Having Such An Input And Output Circuit," which claims priority to German Application No. DE 10355116.6, filed on Nov. 24, 2003, and titled "Input And Output Circuit Of An Integrated Circuit, Method For Testing An Integrated Circuit And Integrated Circuit Having Such An Input And Output Circuit," the entire contents of which are hereby incorporated herein by reference.

FIELD OF THE INVENTION

The invention relates to an input and output circuit of an integrated circuit, a method for testing an integrated circuit having such an input and output circuit and an integrated circuit having such an input and output circuit.

BACKGROUND

For testing integrated semiconductor circuits, testers or automatic test equipment are used in which the semiconductor circuits are contacted on a test socket by so-called probe cards via a load board. In conventional tests, every terminal contact of the semiconductor circuit to be tested is contacted by a test contact of the probe card and connected to a separate tester channel. The test equipment for such a tester is expensive and relatively significant because, for each signal terminal of the integrated circuit to be tested, one test contact and one tester channel must be provided. This relatively expensive equipment and valuable contacting expenditure also makes an "at speed test" more difficult in which it is required to apply and evaluate the test signals at the speed needed by the integrated circuit to be tested in each case. In addition, only little compatibility of the tester equipment is given with such complete contacting of all signal terminals especially since different probe cards, different programs, and allocations of the tester channels of the tester must be provided for different types of circuits to be tested.

It is conceivable to replace this complete test principle described by a test in which only a number of the signal terminals on the circuit to be tested are contacted since certain areas of the circuit are combined. This would make it possible to achieve a considerable acceleration of the test and distinct cost reduction. However, it is associated with a reduction in the quality of checking.

Until this time, especially for testing DC parameters, it has been mandatory to provide external contact arrangements, e.g., passive circuits on the test socket, or a contact arrangement with a test system for all signal terminals of the circuit to be tested.

SUMMARY

The invention specifies input and output circuits of integrated circuits which can be reliably checked even without direct contact arrangement. In addition, the invention specifies a circuit in which a comprehensive test is also possible if only a part of the signal terminals is contacted. Furthermore, an efficient and cost-effective method for testing an integrated circuit is specified in which not all signal terminals of the integrated circuit to be tested need to be contacted by the tester.

The input and output circuit according to an exemplary embodiment of the invention is divided into a signal terminal for external contacting, into a protective circuit, i.e., ESP protective circuit, into an input driver and/or into an output driver and into at least one additional circuit. This input and output circuit can also be called a bi-directional digital input/output signal terminal or a bi-directional digital I/O cell. The input driver and/or the output driver and the first input of the additional circuit are connected to the signal terminal via the protective circuit. At the output of the additional circuit, a test value for the operation of the input and output circuit can be read and the operation of the input and output circuit can be evaluated.

The output and input driver can be constructed as transistor circuits. The input driver transistors are in most cases smaller than the output driver transistors.

According to the invention, test evaluations can be performed at different voltage levels by the additional circuit incorporated in the input and output circuit.

The parameters of the input and output circuit which can be checked according to the invention are the DC parameters which can be measured at the signal terminal of the input and output circuit. In particular, it is possible to determine and to test the following DC parameters of the input and output circuit without direct external contacting of their signal terminal:

the switching thresholds of the input drivers (VIL, VIH),
the levels of the output drivers under load (VOL, VOH),
the pull-up and pull-down currents (PUI, PDI) and
the leakage (IIL, IIH).

These parameters can be advantageously tested with the same test insertion.

For this purpose, voltage levels are supplied to the circuit to be tested from an external voltage source and supplied as reference level or as input level to the input and output circuit via suitable circuits. Due to the fact that the input and output circuit according to the invention can be tested reliably without direct external contacting, considerable costs can be saved both in the tester components, particularly in the arrangement of the probe cards to be used and of the tester to be used and due to a shorter test duration. Costs can be saved particularly in the probe cards to be used because the testing of integrated circuits with a number of input and output circuits according to the invention now only requires a relatively small number of test contacts. Probe cards having fewer test contacts are more cost effective because the price of probe cards has an essentially linear relationship with the number of their test contacts.

This potential of saving is very high especially since, during a production process of a conventional integrated circuit, a number of different tests occur in which the test savings which can be realized by the present invention can be achieved in each case. This is because, in current production methods, semiconductor chips are generally tested for maintenance of the predetermined and desired specifications once to three-times on the wafer and further once to three-times after the circuit has been installed in its package after conclusion of the wafer production.

According to a further advantage of the invention, a number of integrated circuits can be simultaneously tested in parallel because the tester channels available in the tester used can be distributed over a greater number of integrated circuits to be tested. As a result, the test costs can be reduced further.

If the input and output circuit has an ESD protection pattern, the desired load current can be set.

According to an advantageous development of the invention, the pull-up transistor and the pull-down transistor are in each case connected to their own voltage supply line.

In a further embodiment of the invention, the protective circuit has at least one protective transistor. Such protective transistors can be used for effectively protecting the integrated circuit against damage or destruction by unintended discharges via the signal terminals.

At the same time, the output drivers can be loaded by these transistors during the test. The input and output circuit can test itself by using external, known reference levels, and thus ensure its functionality. As a result, a maximum of functional reliability is achieved. Furthermore, a higher maximum degree of parallel testing can be achieved. By means of freely adjustable test evaluation levels which can be supplied from the outside, the same parameters can be checked as when a test system is used.

If additionally one switch each is provided for the pull-up transistor and for the pull-down transistor such that these transistors can be switched back and forth between the relevant voltage supply line and an additionally provided reference voltage line, either the level of the voltage supply line or of the reference voltage line can be simultaneously applied to all input and output circuits without having to provide an additional connection. Having an input and output circuit arranged in this manner makes it possible to test the switching thresholds of the input drivers in a particularly reliable manner.

These switches can be advantageously constructed as, but not limited to: transmission gates, as transfer gates or as transistors.

The reference voltage lines are advantageously connected to at least one reference voltage source. This can be constructed either on the integrated circuit itself or also externally, i.e. for example on the load board or in the test instruments of the tester.

According to a further embodiment of the invention, the input and output circuit also comprises a logic unit for controlling the protective transistors. For this purpose, transverse-voltage lines are to be provided which connect the logic unit to the protective transistors.

In a particularly advantageous development of the input and output circuit, the additional circuit is constructed as analog comparator at the test signal input of which the signal present at the relevant signal terminal can be applied and at the reference input of which a reference signal can be applied. Such a comparator makes it possible to reliably determine whether the test signal present at the signal terminal is above or below an individually adjustable reference level.

This bypasses the problem occurring in the current built-in self test, namely that the evaluation level, as a rule, is permanently set and is approximately half the supply voltage. Instead, according to the invention, it is ensured that both the test of the leakage currents of the signal terminal and of the output voltage can take place under load at the conditions specified in the specification. This largely avoids the risk of performing a misevaluation.

The reference level needed jointly for the comparators of all input and output circuits can be either generated via a digital/analog converter existing in the integrated circuit or applied from the outside, for example by the tester. Feeding the reference level in from the outside can be done via a preexisting suitable signal terminal or via a reference level signal terminal to be additionally provided on the semiconductor circuit.

The reference level can be forwarded or controlled via transfer gates that permit only low currents to flow and therefore, only occupy a small circuit area. The reference level present at the signal terminal is evaluated by means of the individually and flexibly adjustable reference level. This reference level can be freely selected between 0% and 100% of the supply voltage of the signal terminal. As a result, a particularly reliable and accurate test of the voltage level present at the signal terminal can be ensured.

In a further embodiment of the input and output circuit according to the invention, the additional circuit comprises two inverters and one logic unit. The two inverters are connected in parallel and connected to the signal terminal via the protective circuit.

Such an additional circuit makes it possible to check the test signal for whether it is within a particular interval. For this purpose, the first inverter is set to a lower switching threshold and the second inverter is set to a higher switching threshold. A suitable lower switching threshold can be, for example, 10% of the supply voltage of the signal terminal and a suitable higher switching threshold can be 90% of the supply voltage. The values present at the outputs of the inverters are combined with one another by the logic unit to form a common output signal output at the output of the logic unit in such a manner that it is possible to determine by means of this output signal whether the test value is within or outside this interval.

As a result, accurate checking of the test signal is possible. The evaluation levels of the inverters are predetermined, for example by the properties of their transistors and by their supply voltages. A displacement or extension of the range covered by these levels during the test is possible, within certain limits, via changing supply voltages.

The additional circuit described above enables the test signals to be checked within a predetermined permissible range. This clearly improves the quality and the information content of the checking of the test signal.

Via the input and output circuit described above, the test value present at the signal terminal can also be checked without direct contacting of the signal terminal.

Both the additional circuit constructed as comparator and the additional circuit having two inverters and one logic unit generate one bit of additional test information each per input and output circuit at the respective test output, which information can be evaluated directly on the integrated circuit or by external test systems.

For the external evaluation, the signal present at the output contact is preferably serially transmitted via a boundary scan device. In the case of an input and output circuit according to the invention, a one data input register and one data output register each are present per signal terminal in the normal case. For the transmission of the additional result bit at the output contact, this result bit can be written into the data output register of the output circuit, e.g., a boundary scan register and the information present at the output contact of the input driver can be stored in the data input register as normal. After the serial transfer to the test device, two bits are then available which specify whether the level is above or below the switching threshold of the input driver and above or below the comparator reference or, respectively, within or outside the range of the two inverters. Thus, no additional boundaries and flipflops are needed. In addition, compatibility to the boundary scan standard IEEE 1149.1 is maintained.

The invention also relates to a method for testing an integrated circuit in which first an integrated circuit is provided in which at least one input and output circuit is constructed as described above. This integrated circuit is connected to a tester in such a manner that only a part of the signal terminals of the integrated circuit is connected to tester contacts and that, in particular, at least one input and output circuit constructed as described above is not tapped by tester contacts. Then signals are applied to the integrated circuit. The signal terminals not physically connected to a tester contact are then checked by means of the additional circuit associated with the relevant signal terminal.

This is because a further basic concept of the invention consists in that the DC parameters of signal terminals, particularly the switching thresholds of the input drivers, the levels of the output drivers and the load, the pull-up and pull-down current and the leakage current of the input and output circuits can be checked without the signal terminals of the individual input and output circuits having to be contacted directly. This results in a distinct simplification of the tester equipment and an accelerated test run.

The test signals determined on the signal terminals not connected to a tester contact can then be stored in a shift register, particularly in a boundary scan circuit, and transmitted serially to the tester used. This provides for an "at-speed" test in which the tester can apply the test signals to the integrated circuit and evaluate them at the desired speed.

It is particularly advantageous if the test signal, present as result bit, plus the relevant input and output circuit is written into a data output register for this input and output circuit and the information of the input driver of the relevant input and output circuit is stored in a data input register. The test results for each input and output circuit can then be analyzed rapidly and comfortably by the tester by using the data output and data input register.

The invention also relates to a method for testing at least one switching threshold of an input driver. In this method, an integrated circuit with at least one input and output circuit described above is provided which is capable of switching the pull-up transistor and the pull-down transistor back and forth between the voltage supply lines and the additional reference voltage lines via switches.

These switches are set in such a manner that the pull-up transistor and the pull-down transistor are connected with one reference voltage line each. Then the switching threshold of the input driver is checked. In this check, voltage levels are applied by a particularly external voltage source to the reference voltage lines which are selected to be lower and/or higher than the switching threshold of the input driver. The voltage values generated by the input drivers at their output due to these voltage levels are detected and evaluated by the tester by being compared with the voltage values expected in each case.

The switching thresholds of the input drivers can be reliably checked by this test method. This is because the voltage levels on the reference voltage lines can be adjusted individually as required.

The invention further relates to a method for testing a switching threshold of an input driver in which an integrated circuit is provided which has at least one input and output voltage described above, with a comparator.

In this arrangement, an electrically neutral signal terminal of an input and output circuit is initially charged up with a constantly rising charging voltage via the pull-up transistor. As an alternative, it is possible to discharge a previously charged signal terminal with a constantly dropping charging voltage.

The voltage values present at the output of the input driver are detected at the point in time at which the comparator registers that the charging voltage exceeds or drops below the reference voltage value. At this switch-over point in time, the tester checks the switching threshold of the input driver by comparing the voltage value present at the output of the input driver with the expected voltage value at the output of the input driver. In the case of a rising charging voltage, for example, the input driver must not yet switch over when the reference voltage is set slightly below the switching threshold. In the case of a reference voltage slightly above the value to be tested, the input driver, in contrast, must already have switched over. With a falling charging voltage, the switch-over points in time of the input driver behave correspondingly.

Using this method according to the invention, the switching thresholds of input drivers can be checked accurately and efficiently. The reference voltage present at the comparator can be adjusted individually. The method according to the invention is independent of the magnitude of the current which is particularly advantageous, especially since greatly fluctuating currents can occur during the production of integrated circuits. The magnitude of the currents must be selected in such a manner that test times easily covered are produced, for example in the range of a few hundred nanoseconds. In the case of signal terminals having high pull-up or pull-down currents leading to very short test times, additional pull-up and pull-down transistors can be provided and activated for the test which allows a lower current.

A further advantage of this switching threshold test method lies in the fact that it can be used independently of the capacitance of the respective signal terminals.

In an advantageous development of this method, the integrated circuit provided comprises a signal memory, i.e., a D latch, the data input of which is connected to the output of the input driver and the clock input of which is connected to the output of the comparator. In this arrangement, the voltage value preset at the output of the input driver at the switch-over point in time is acquired and stored in the signal memory. The output of the signal memory can be read out for evaluation, for example via a boundary scan register. This results in the possibility of processing and analyzing the test values "at speed."

According to a further embodiment of the invention, the integrated circuit to be tested can comprise a boundary scan cell, the update signal input of which is connected to the output of the comparator. The additional circuit is restricted to multiplexers in this case.

The invention also relates to a method for testing at least one output driver of a signal terminal under load. In this method, an integrated circuit with at least one input and output voltage described above is initially provided which has a logic unit via which the ESD pull-up transistor and/or the ESD pull-down transistor can be controlled. The current of the associated supply of the reference voltage current is initially measured by the external tester with the output driver switched on and then with the output driver switched off. Then, the difference of the current values measured in this manner is determined. On the basis of this, a statement can be made about the functionality of the tested output driver of the relevant input and output circuit.

This method makes use of the finding that the higher current flowing in the supply line can be measured when the load current is greater than the specified output current under nominal conditions, for example due to the dimensioning of the ESD pull-up and ESD pull-down transistors of the protective circuit. It is assumed here that the output drivers have output transistors. To test these output transistors under load, corresponding load paths must exist, and activate a further test, on the integrated circuit to be tested. According to the method described, the transistors of the protective circuits connected to the supply line are partially or completely opened. These ESD pull-up and ESD pull-down transistors are then also tested at the same time.

As an alternative, it is possible that the output transistors of the output driver are present as additional pull-up and pull-down transistors which are dimensioned for the desired specified load current and thus form the load current for the other transistor in each case. These transistors are relatively large and need a large area.

According to the test method, the desired current is set and the voltage at the signal terminal is evaluated at the desired levels by using the comparator circuit or the two inverters.

The invention also relates to a method for testing at least one input and output circuit of an integrated circuit. In this method, the test equipment itself is tested and the inherent safety of the method is considered. In a first method step, an integrated circuit first provided which comprises at least one input and output circuit described above, comprises a comparator. Then the switching thresholds of at least one comparator are measured by adjusting the reference voltage at the reference input of the comparator, progressively applying various levels of supply voltages via either the pull-up transistor and/or via the pull-down transistor to the relevant signal terminal and to the relevant input of the comparator and by evaluating the output values generated in each case at the output of the comparator.

This is because a critical checking of the exactness and reliability of the results is important in test methods which are partially performed as self tests. Determining parameters for this are, in particular, the evaluation levels of the comparators including their function, the accuracy of the levels applied to the inputs and the output currents generated.

According to the invention, it is proposed, as in the method described above for testing the input thresholds of the input drivers, to apply different voltage levels, e.g., 10%, 50% and 90% of the supply voltage, via the pull-up and pull-down transistors to the signal terminal(s) and thus to the inputs of the comparators connected to them and their switching thresholds with correspondingly adjusted reference voltages at the reference input of the comparators.

If the switch-over of the pull-up and pull-down transistors via the switches for the reference supply voltages is omitted, it is possible, as an alternative, to implement a switch-over to the supply voltage or to the reference voltage of the core logic only for the pull-up transistors. In this arrangement, only a fixed level is provided for testing the comparator. Instead, the additional supply voltage lines can be advantageously saved.

The reference and input voltages required for the tests can be supplied either from the outside or generated internally. When supplied from the outside, the level is known and can be regularly checked at the tester. When the reference and input voltages are generated on the integrated circuit, for example via digital/analog converters, checking is required, for example by comparison with a voltage supplied from the outside. The comparators are checked by supplying both the reference voltage and the input voltage at the signal terminal, for example by pull-up and pull-down transistors, as known voltages from the outside. If no leakage current is present at the signal terminal, the voltage active at the input is equal to the voltage applied from the outside in dependence on the transistor switched on. Any leakage current which may be present which could cause a voltage drop and thus an offset is reliably detected in the leakage test.

The load current cannot be adjusted precisely due to unavoidable production tolerances. Instead, it is possible to determine the magnitude of the current from the received current in the supply line from the outside. This reliably avoids, for example, a weak output driver from being detected as not faulty on a load which is too low.

The invention also relates to an integrated circuit which comprises at least one input and output circuit described above. The DC parameters of such an integrated circuit can be checked with relatively little expenditure because it suffices for such a check if only a part of its signal terminals are contacted by an external tester.

In a first embodiment, the integrated circuit comprises at least one internal voltage source, particularly a digital/analog converter for generating reference and input voltages. As a result, such an integrated circuit can be tested rapidly and reliably without needing to apply voltages from an external voltage source.

In an advantageous development of the invention, the integrated circuit comprises at least one signal memory, particularly a D latch, the data input of which is connected to the output of at least one input driver and the clock input of which is connected to the output of at least one input driver and the clock input of which is in each case connected to the output of the relevant comparator. As a result, the output signal of the input driver can be reliably detected and stored which results in a further increase in the functionality of the integrated circuit.

In a further embodiment of the integrated circuit, at least one shift register, particularly a boundary scan cell is additionally provided on the integrated circuit, by which the test results can be stored and forwarded. This results in a high functionality of the integrated circuit.

Such a boundary scan cell can be adapted very simply to the input and output circuit according to the invention by providing an additional multiplexer for each boundary scan cell. The additional circuit expenditure is restricted to multiplexers in this case.

In this arrangement, an output of the multiplexer can be connected to the output of the additional circuit according to the invention and a further input of the multiplexer can be connected to the core logic of the integrated circuit. The multiplexer can be adjusted in accordance with the operating mode of the boundary scan cell via a control line of the multiplexer.

Furthermore, an output register can be provided which has an input multiplexer to which the output of the multiplexer is connected.

In summary, it can be stated that due to the integrated circuit with the inventive input and output circuits, dealt with in the present invention, and due to the methods described in the present invention, a greater extent of parallel testing can be achieved in the test, particularly compared with previously used tester solutions, in which each tester channel is connected to one signal terminal each of the integrated circuit.

The devices and methods according to the invention can be used to reliably check DC parameters. This is of advantage, particularly in the case of digital signal terminals which do not need to be tested at full speed. In the case of port pins of micro controllers, for example, it is only necessary to check the DC parameters especially since these port pins are only needed for quasi-static controls of external signals.

Using the additional circuits of the input and output circuits, proposed in accordance with the invention, the input leakage test can be tested with the same parameter set up as when using a test system.

BRIEF DESCRIPTION OF THE DRAWINGS

The invention is illustrated in greater detail in the drawings with reference to a number of exemplary embodiments.

DETAILED DESCRIPTION

Figure 1:
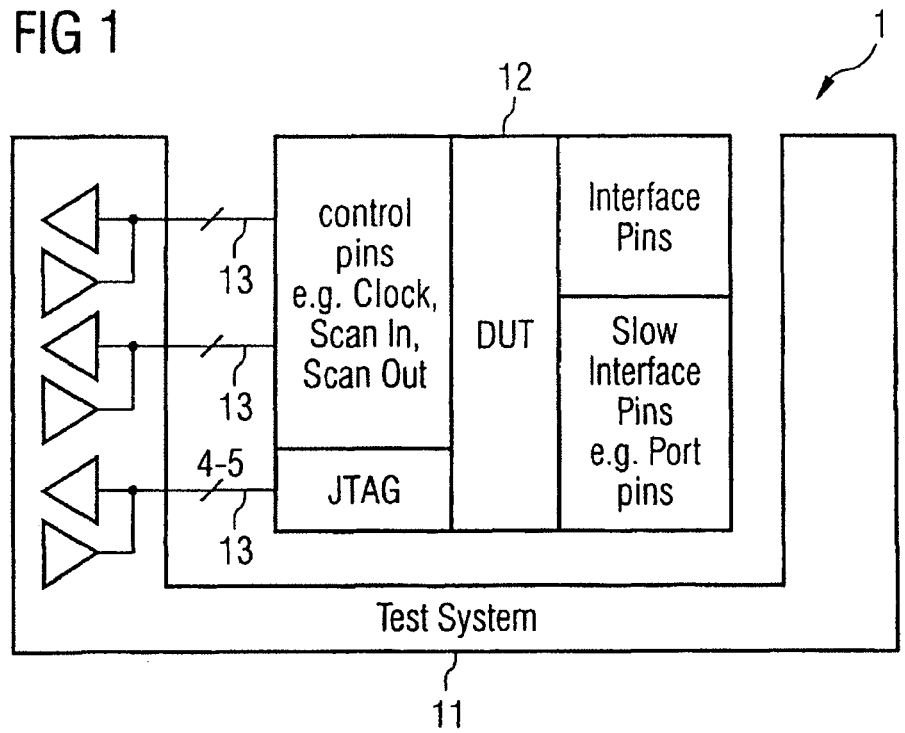
FIG. 1 shows a diagrammatic test representation with a test system and with a test circuit.

FIG. 1 shows a diagrammatic test representation 1 with a test system 11 and with a test circuit 12.

The test system 11, shown to be U-shaped, is shown simplified for reasons of illustration. Current test systems comprise highly sensitive measuring instruments from which connecting lines emanate and are conducted via a loadboard to a test socket for test circuits in a package or on the test contacts of probe cards by which the integrated circuits to be tested are contacted. Furthermore, a current test system has a computer control and an evaluating unit by means of which the test run, particularly the test stimuli to be applied progressively to the test circuit, are controlled and the output data generated in dependence thereon are detected and evaluated. The terms "tester" and "test system" have the same meaning in this document.

The test circuit 12, also shown diagrammatically in FIG. 1, comprises a multiplicity of pins which are subdivided into control pins, for example one or more clock pins, into one or more scan-in pins, into one or more scan-out pins, into interface pins, into slow interface pins, for example port pins, and into JTAG (1149.1 IEEE) pins.

According to the representation in FIG. 1, test connections 13 are provided between the test system 11 and the control pins and the JTAG pins. These test connections 13 connect every pin on the test circuit 12 with one test channel each of the test system 11. In the test representation 1, the interface pins are not connected to the test system 11 as is the case in the current test setup.

Figure 2:
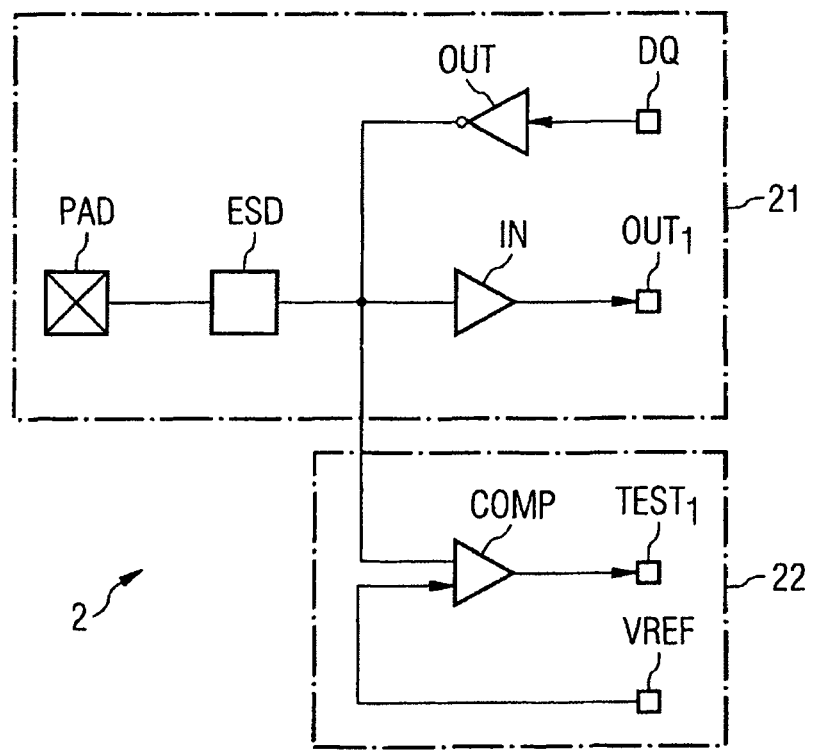
FIG. 2 shows a circuit diagram of a first input and output circuit of the test circuit from FIG. 1 with a basic circuit and with a first additional circuit.

FIG. 2 shows a circuit diagram of a first input and output circuit 2 with a basic circuit 21 and with a first additional circuit 22 arranged there under.

The entire basic circuit 21 shown in FIG. 2 is commonly called a "bi-directional digital I/O cell". The basic circuit 21 comprises the actual signal terminal PAD, in front of which an electrostatic discharge protection circuit is arranged, which will be called ESD protection circuit in the text which follows. The ESD protection circuit, which is relatively large in practice, is arranged directly at the signal terminal PAD and comprises elements not shown in FIG. 2 which are connected like a protective diode. The ESD protection circuit can be used for shunting unwanted currents applied to the signal terminal PAD and thus to protect the integrated circuit against damage. Such an unwanted current flow can occur, for example, due to an electrostatic discharge when touching the signal terminal PAD with one's hand.

An input driver IN and an output driver OUT are connected in parallel to the output of the ESD protection circuit. The input of the output driver OUT is connected to an output driver input contact DQ. The output of the input driver IN leads to an input driver output contact $OUT_1$.

The additional circuit 22 according to the invention comprises a comparator COMP, the signal input of which is connected in parallel with the input driver IN and with the output driver OUT and is connected to the signal terminal PAD via the ESD protection circuit. The reference input of the comparator COMP is connected to a reference level input contact VREF to which the desired voltage level is applied from the outside. As an alternative, it is possible to generate the reference voltage on the test circuit itself, for example via a DA converter. The output of the comparator COMP is connected to a comparator output contact $TEST_1$ at which the output value generated by the comparator COMP can be picked up.

This additional circuit 22 can be integrated in all input and output circuits of a test circuit 11. The reference inputs of all comparators COMP can then be connected to one another and connected to a reference level input contact VREF.

During a test, the comparator COMP performs the evaluation, particularly the comparison of the voltage value present in front of the ESD protection circuit, with the reference signal present at the reference input of the comparator COMP, supplied from the outside. The comparator COMP outputs at its output, e.g., a comparator reference specific voltage level "Low" when the input voltage present at the signal input is below the reference level. If the voltage present at its signal input is above the reference voltage, the comparator COMP outputs at its comparator output a comparator-specific level "High". A reverse combination of the output levels of the comparator COMP is also possible.

The voltage value present at the reference input of the comparator COMP can be selected individually and freely within the interval limited at the top and at the bottom only by the supply voltage of the comparator COMP.

As a result the test signal present at the signal terminal PAD can be checked without direct contacting. The comparator COMP compares this test signal with the reference voltage and provides at its output a test value which can be evaluated internally in the test circuit 12 or can be picked up and evaluated externally in a suitable manner.

The first input and output circuit 2 can also be used for measuring the leakage current of the input driver IN with respect to High (IIH) and with respect to Low (IIL).

According to the invention, the comparator COMP of the input and output circuit 2 can be used as evaluator for a test of the output driver OUT (VOH/VOL) and for a test of the switching thresholds of the input driver IN (VIH/VIL).

Figure 3:
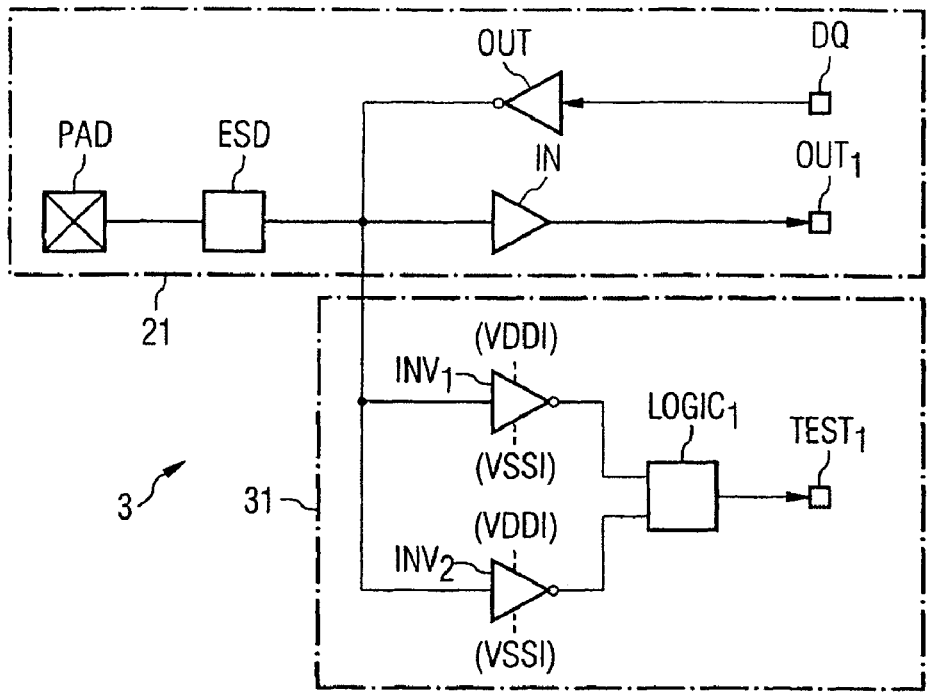
FIG. 3 shows a circuit diagram of a second input and output circuit of the test circuit from FIG. 1 with the basic circuit from FIG. 2 and with a second additional circuit.

FIG. 3 shows a circuit diagram of a second input and output circuit 3 of the test circuit 12 with the basic circuit 21 and with a second additional circuit 31.

The basic circuit 21, of the second input and output circuit 3, corresponds to that of the first input and output circuit 2.

The second additional circuit 31 has a first inverter $INV_1$ and a second inverter $INV_2$ which are connected in parallel and the inputs of which are connected to the signal terminal PAD via the ESD protection circuit. The first inverter $INV_1$ is set to a low switching threshold, to 0.3 V in the present exemplary embodiment, by suitable dimensioning of its transistors. The switching point of the second inverter $INV_2$ is set to an upper switching threshold of 3 V in the example. The outputs of the inverters $INV_1$ and $INV_2$ are connected to a first logic unit or $LOGIC_1$ which combines the two output signals of the inverters $INV_1$ and $INV_2$ into a single signal and outputs this signal at its output. This output signal is supplied to an output contact $TEST_1$ at which it can be picked up and evaluated. Various combinations of switching thresholds are possible.

A logical one or, respectively, a logical level "High" at the output contact $TEST_1$ indicates, for example, the input signal at the signal terminal PAD is between the two switching thresholds of 0.3 V and 3 V and a logical zero or, respectively, a logical level "Low" at the output contact $TEST_1$ indicates a level at the signal terminal PAD which is outside this interval.

The second input and output circuit 3 can also be used for measuring the leakage current of the input driver IN with respect to High (IIH) and with respect to Low (IIL).

Figure 4:
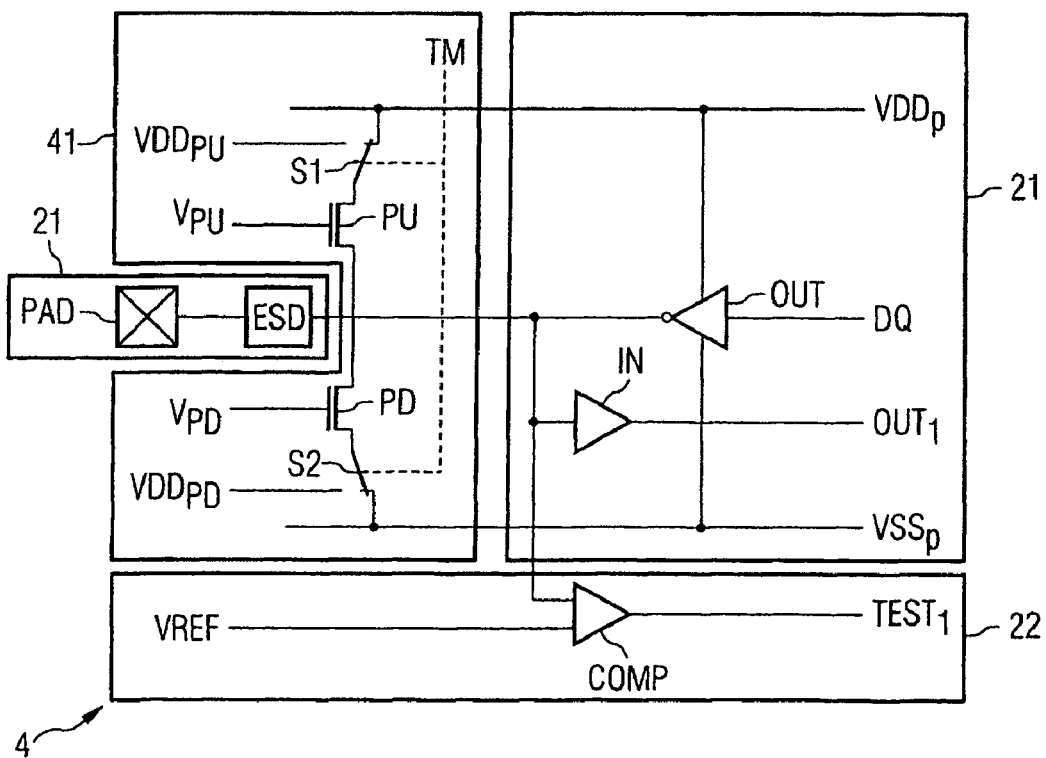
FIG. 4 shows a circuit diagram of a third input and output circuit of the test circuit from FIG. 1 with the basic circuit and with the first additional circuit from FIG. 2 with a third additional circuit.

FIG. 4 shows a circuit diagram of a third input and output circuit 4 of the test circuit 12 with the basic circuit 21, with the first additional circuit 22 and with a third additional circuit 41.

The third input and output circuit 4 represents a development of the first input and output circuit 2 shown in FIG. 2. The basic circuit 21 with the signal terminal PAD, with the ESD protection circuit, with the input driver IN and with the output driver OUT and the first additional circuit 22 with the comparator COMP exhibit the same arrangement as in FIG. 2 and, therefore, will not be explained in further detail.

The input driver output contact $OUT_1$, the output driver input contact DQ, the comparator output contact $TEST_1$ and the reference level input contact VREF are not explicitly shown in FIG. 4. Instead, the input driver output line $OUT_1$, the output driver input line DQ, the comparator output line $TEST_1$ and the reference level input line VREF are provided with the reference symbols of the aforementioned contacts.

The third additional circuit 41 provides a pull-up transistor PU and a pull-down transistor PD which can be controlled via the pull-up transistor transverse-voltage line $V_{PU}$ and via the pull-down transistor transverse-voltage line $V_{PD}$. The pull-up transistor PU and the pull-down transistor PD are used like ohmic resistors. They are used for setting the uncontrolled signal terminal PAD to a defined voltage level.

The third additional circuit 41 also has a first switch $S_1$ for the pull-up transistor PU and a second switch $S_2$ for the pull-down transistor PD. These switches $S_1$ and $S_2$ are shown here as switches only in order to simplify the illustration and are constructed as transmission gates or as transfer gates in practice.

The pull-up transistor PU can be switched back and forth between a signal terminal supply line $VDD_P$ and a pull-up transistor reference voltage line $VDD_{PU}$, by means of the first switch $S_1$. The pull-down transistor PD can be switched back and forth between a further signal terminal supply voltage line $VSS_P$ and a pull-down transistor reference voltage line $VDD_{PD}$ by means of the second switch $S_2$. The switches $S_1$ and $S_2$ are controlled via the control line TM shown dashed in FIG. 4.

The third input and output circuit 4 can be used for testing the input switching thresholds (VIH and VIL of the input driver IN. The input levels to be applied to the inputs are fed in via the reference voltage lines $VDD_{PU}$ and $VDD_{PD}$ and connected progressively to the input of the input driver IN via the pull-up transistor PU and via the pull-down transistor PD.

In a first method for testing the switching thresholds of the input driver IN, the transistors PU and PD are disconnected from the supply voltage lines $VDD_P$ and $VSS_P$ via the switches $S_1$ and $S_2$ in a special test mode and, instead, are supplied with separate reference voltage levels via the reference voltage lines $VDD_{PU}$ and $VDD_{PD}$. The separate reference voltage levels are generated internally on the test circuit 12 or externally and applied to the reference voltage lines $VDD_{PU}$ and $VDD_{PD}$ via suitable signal terminals. These reference voltage levels preferably vary within an interval of between 0 V and the supply voltage VDD.

As a result, either the reference voltage level $VDD_{PD}$ or $VDD_{PU}$ are present at all signal terminals PAD when the pull-up transistor PU and the pull-down transistor PD are switched on without needing an additional connection to the test system 11. For testing the switching threshold of the input driver IN, a voltage below the expected switching threshold is applied for one, and another voltage above the switching threshold is applied, and it is tested whether the input driver IN in each case detects "Low" at one time and "High" at the other time.

This method is distinguished by high accuracy and by high reliability because of the voltages supplied from the outside or generated internally.

In a further method for testing the switching thresholds of the input driver IN, the desired level variation for testing the switching thresholds VIH and VIL of the input driver IN is generated on the test circuit 12 itself. In this arrangement, a signal terminal PAD, which is initially electrically neutral, is charged up via a relatively low pull-up current of the pull-up transistor PU. In this process, all voltage levels will pass between 0 V and the supply voltage VDD including the switching thresholds to be tested. The voltage rise is dependent on the capacitance of the signal terminal PAD and of the pull-up current due to the production parameters. The input driver IN switches over at the associated switching threshold to be tested. The comparator COMP connected to this signal terminal PAD switches over at the reference voltage present at the reference level input line VREF. The comparator COMP detects independently of the current present in each case when the voltage present at the signal terminal PAD has reached the desired value. At this point in time, the comparator COMP switches over. At the same time, the input driver output line $OUT_1$ is interrogated.

When the reference voltage is set, e.g., slightly below the switching threshold of the input driver IN, the input driver IN must not switch over yet. In the case of a reference voltage which is slightly above the value to be tested, the input driver IN must already have switched over. Using this method, the switching threshold of the input driver IN can be checked very precisely.

This checking of the upper switching threshold VIH of the input driver IN has been described above by means of pull-up currents and a rising edge. An analogous check of the lower switching threshold VIL of the input driver IN is performed with pull-down currents and with a falling edge, especially in the case of switching thresholds VIH and VIL with hysteresis.

Figure 5:
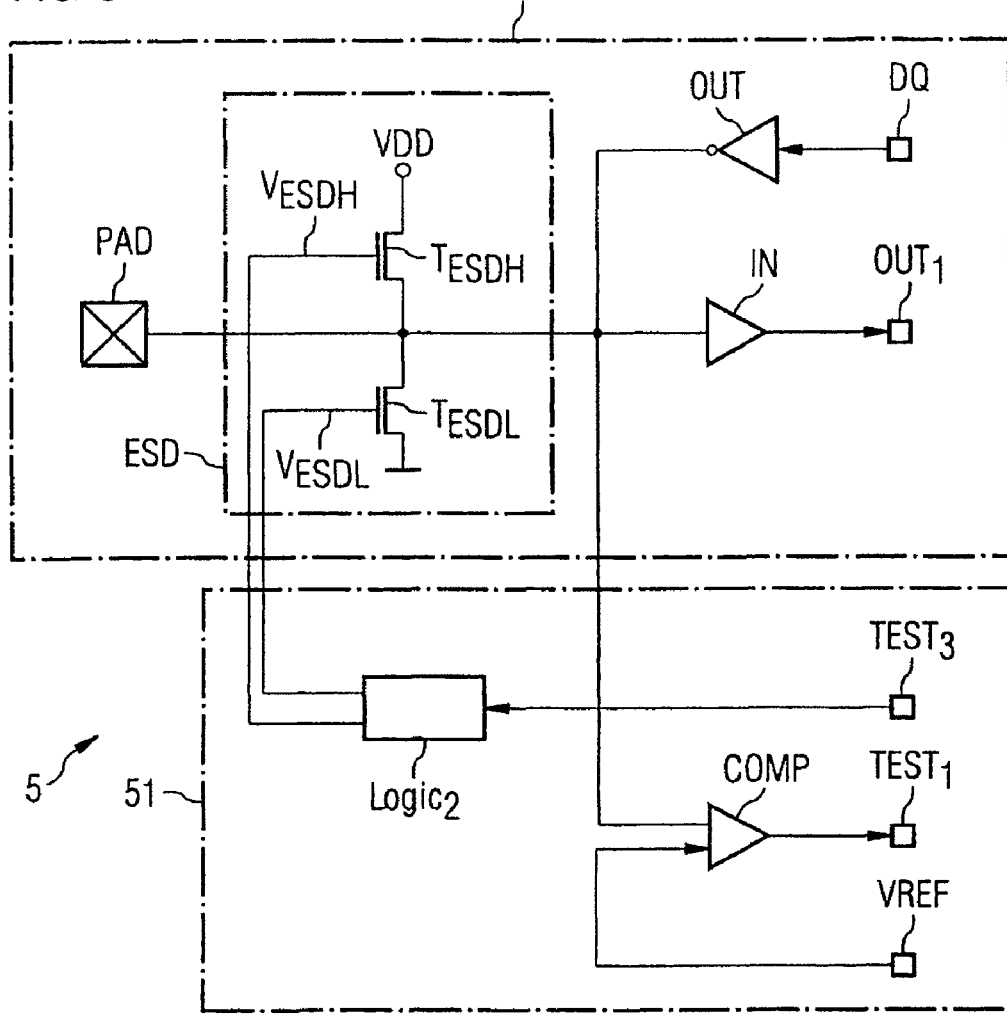
FIG. 5 shows a circuit diagram of a fourth input and output circuit of the test circuit from FIG. 1 with the basic circuit from FIG. 2 and with a fourth additional circuit.

FIG. 5 shows a circuit diagram of a fourth input and output circuit 5 of the test circuit 12 with the basic circuit 21 and a fourth additional circuit 51.

In this arrangement, the basic circuit 21 corresponds to the basic circuit 21 already described with reference to FIG. 2 and the transistor $T_{ESDH}$ and the transistor $T_{ESDL}$ of the ESD protection circuit can be seen in FIG. 5.

The pull-up transistor PU and the pull-down transistor PD are not shown in FIG. 5 to increase clarity.

The fourth additional circuit 51 differs from the first additional circuit 22 in as much as a second logic unit $LOGIC_2$ and a test contact $TEST_3$ are provided in addition to the comparator COMP, to the comparator output contact $TEST_1$ and to the reference level input contact VREF.

The second logic unit $LOGIC_2$ can be controlled by means of the signals supplied at the test contact $TEST_3$. The second logic unit $LOGIC_2$ is connected to the transistor $T_{ESDH}$ and to the transistor $T_{ESDL}$ by means of transistor transverse-voltage lines $V_{ESDH}$ and $V_{ESDL}$. Correspondingly, the transistors $T_{ESDH}$ and $T_{ESDO}$ can be controlled by the second logic unit $LOGIC_2$.

In the method according to the invention for testing the output driver OUT under load (VOH/VOL), the desired current is fed by one of the methods described above and the voltage level at the signal terminal PAD is evaluated at the desired level by using the comparator COMP. If the load current is greater than the specified output current under nominal conditions, for example due to the dimensioning of the ESD protection circuit, the higher current of the supply voltage line $VDD_P$ or $VSS_P$, respectively, flowing in this case, can be measured. For this purpose, the current of the associated supply $VDD_p$ OR $VSS_p$, respectively, is measured by the external test system 11 both with the output driver OUT switched on and switched off and from this the difference is determined. This method must be performed sequentially.

The method described above can also be used for measuring protective diodes.

The test methods described above have been described in each case with reference to the comparator COMP used for evaluation. As an alternative, the second additional circuit 31 with the inverters $INV_1$ and $INV_2$, shown in FIG. 3, can also be used in each case for evaluation.

Figure 6:
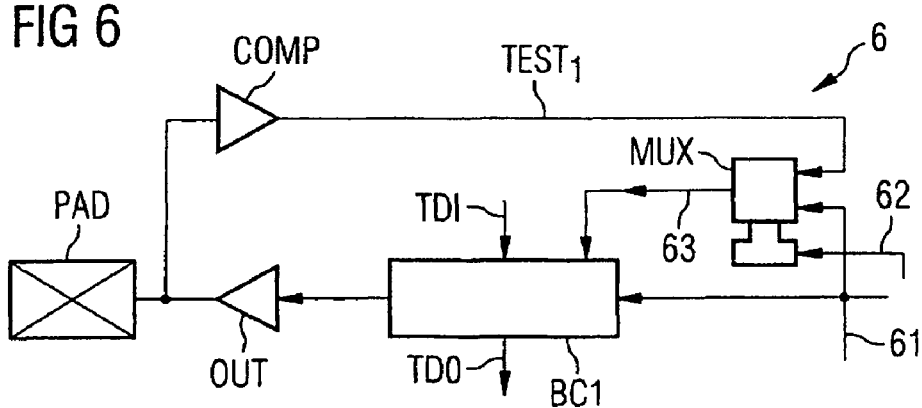
FIG. 6 shows a diagrammatic representation of an evaluating circuit for the first additional circuit from FIG. 2.

FIG. 6 shows a diagrammatic representation of the evaluation circuit 6 for the first input and output circuit 2.

Figure 7:
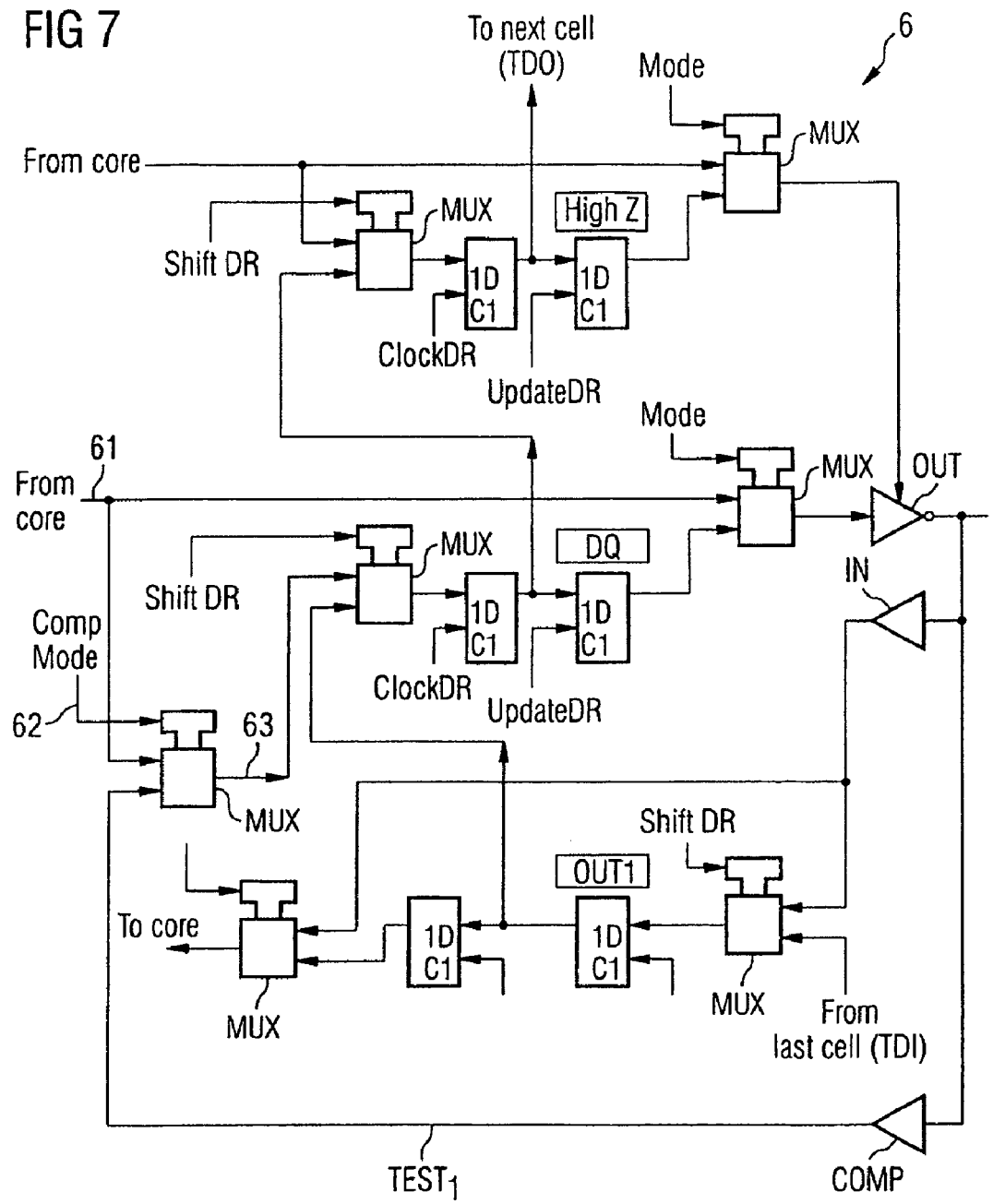
FIG. 7 shows an enlarged diagrammatic representation of the evaluating circuit from FIG. 6.

FIG. 7 shows an enlarged diagrammatic representation of the evaluation circuit 6. In the representation in FIG. 7, it must be noted that it is constructed as mirror image compared with the representations of FIGS. 2 and 6.

The ESD protection circuit and the input driver IN and the contacts $OUT_1$ and VREF have been omitted in FIG. 6 for reasons of clarity. The comparator COMP is shown above the output driver OUT in FIG. 6.

The evaluation circuit 6 has a boundary scan cell BC1 which corresponds to the IEEE 1149.1 standard. In the representation of FIG. 6, the boundary scan cell BC1 has an input line TDI and an output line TDO by means of which it is connected in each case to the preceding and to the following boundary scan cell BC1 of the boundary scan device. The comparator output line $TEST_1$ can be transferred preferably serially via a boundary scan device for the external evaluation.

For this purpose, in each case one data input register $OUT_1$ and a data output register DQ are provided per signal terminal PAD for an input and output circuit, for example for the first input and output circuit 2, which can be easily seen in FIG. 7. The data input register $OUT_1$ and data output register DQ are connected to the input driver output line $OUT_1$, shown, for example in FIG. 4, and to the output driver input line DQ, respectively, also shown in FIG. 4, and are identified by the same reference symbols in each case, therefore.

The evaluation circuit 6 also comprises a multiplexer MUX, the first input of which is connected to the comparator output line $TEST_1$. The second input of the multiplexer MUX is formed by a core logic connecting line 61 which is also connected to the boundary scan cell BC1. Correspondingly, the second input of the multiplexer MUX receives its input signal from the core logic of the integrated circuit on which the first input and output circuit 2 is located. At the boundary scan cell BC1, this signal of the call logic is directly connected to an input multiplexer, not shown in FIG. 6, of the output register DQ.

The multiplexer MUX also has a multiplexer control line 62 via which the operating mode is determined in which the boundary scan cell BC1 is to operate, that is to say either as the standard boundary scan cell BC1 or in the test mode for reading out the test information of the comparator output line $TEST_1$.

The output of the multiplexer MUX is formed by a multiplexer output line 63 which is connected to the input multiplexer of the output register DQ.

The additional result bit present at the comparator output line $TEST_1$ can be written into the data output register DQ of the signal terminal by an evaluation circuit 6 constructed in this manner.

The information of the input driver IN, not shown in FIG. 6, present at the input driver output line $OUT_1$ is stored in the data input register $OUT_1$, as usual.

FIG. 7 shows the adaptation of an I/O boundary scan cell BC1 for evaluating the additional information of the comparator COMP in accurate detail. Similar adaptations are possible in all boundary scan cells.

After the serial transmission of the test values to the test device, not shown in FIG. 7, two bits are then available, namely one bit in the data input register $OUT_1$ and a further bit in the data output register DQ which is the test value of the comparator output line $TEST_1$. These two bits specify whether the level at the signal terminal PAD is above or below the reference level present at the reference input of the comparator COMP.

The evaluation circuit 6 shown in FIGS. 6 and 7 can also be arranged with the second additional circuit 31, shown in FIG. 3, with the inverters $INV_1$ and $INV_2$ and with the first logic unit $LOGIC_1$. The expert can arrive at this conversion by himself from the description of the evaluation circuit 6. When the second additional circuit 31 is used, the two bits of the data input register $OUT_1$ and of the data output register DQ specify whether the level at the signal terminal PAD is within or outside the voltage interval formed by the two inverters $INV_1$ and $INV_2$.

Such an evaluation circuit 6 does not need any additional boundary scan flipflops. In addition, compatibility with the boundary scan standard IEEE 1149.1 is maintained.

What is claimed is:

1. An integrated circuit, comprising:
    at least one input and output circuit, comprising:
    a signal terminal that provides an external contact;
    a protective circuit coupled to the signal terminal;
    an input driver and/or an output driver coupled to the signal terminal via the protective circuit;
    an additional circuit including a first input coupled to the signal terminal via the protective circuit, and an output that provides a test value for operation of the input and output circuit;
    a pull-up transistor connected to a first voltage supply line;
    a pull-down transistor connected to a second voltage supply line;
    a first switch for switching the pull-up transistor between the first voltage supply line and a first reference voltage line; and
    a second switch for switching the pull-down transistor between the second voltage supply line and a second reference voltage line.

2. The integrated circuit of claim 1, wherein the first and second switches comprise a transmission gate, a transfer gate, or a transistor.

3. The integrated circuit of claim 1, wherein the first and second reference voltage lines are connected to at least one reference voltage source.

4. The integrated circuit of claim 1, wherein the protective circuit comprises at least one protective transistor.

5. The integrated circuit of claim 1, further comprising:
at least one voltage source comprising a digital/analog converter for generating reference and input voltages on the integrated circuit.

6. An integrated circuit, comprising:
at least one input and output circuit, comprising:
a signal terminal that provides an external contact;
a protective circuit coupled to the signal terminal, the protective circuit comprising at least one protective transistor;
an input driver and/or an output driver coupled to the signal terminal via the protective circuit; and
an additional circuit including:
a first input coupled to the signal terminal via the protective circuit; and
an output that provides a test value for operation of the input and output circuit; and
a logic unit that controls the at least one protective transistor.

7. The integrated circuit of claim 6, further comprising at least one shift register comprising a boundary scan cell.

8. The integrated circuit of claim 7, further comprising a multiplexer coupled to the boundary scan cell.

9. The integrated circuit of claim 8, wherein the multiplexer comprises:
a first input connected to the output of the additional circuit;
a second input connected to the logic unit; and
a control line that adjusts the multiplexer in accordance with an operating mode of the boundary scan cell.

10. The integrated circuit of claim 8, further comprising an output register including an input multiplexer that is connected to the output of the multiplexer.

11. An integrated circuit, comprising:
at least one input and output circuit, comprising:
a signal terminal that provides an external contact;
a protective circuit coupled to the signal terminal;
an input driver and/or an output driver coupled to the signal terminal via the protective circuit; and
an additional circuit including:
a first input coupled to the signal terminal via the protective circuit;
an output that provides a test value for operation of the input and output circuit; and
an analog comparator including a test signal input for applying the signal present at the signal terminal, and a reference input for applying a reference signal.

12. The integrated circuit of claim 11, further comprising:
a signal memory comprising a D latch and including a data input and a clock input, wherein an output of the input driver is connected to the data input of the signal memory, and the clock input of the signal memory is connected to the output of the analog comparator.

13. An integrated circuit, comprising:
at least one input and output circuit, comprising:
a signal terminal that provides an external contact;
a protective circuit coupled to the signal terminal;
an input driver and/or an output driver coupled to the signal terminal via the protective circuit; and
an additional circuit including;
a first input coupled to the signal terminal via the protective circuit;
an output that provides a test value for operation of the input and output circuit;
first and second inverters being connected to the signal terminal via the protective circuit; and
a logic unit that combines output signals of the first and second inverters to form a common output signal.

* * * * *